United States Patent
Farrell et al.

(10) Patent No.: US 8,853,101 B1
(45) Date of Patent: Oct. 7, 2014

(54) METHODS FOR FABRICATING INTEGRATED CIRCUITS INCLUDING FORMATION OF CHEMICAL GUIDE PATTERNS FOR DIRECTED SELF-ASSEMBLY LITHOGRAPHY

(71) Applicant: GLOBALFOUNDRIES, Inc., Grand Cayman (KY)

(72) Inventors: Richard A. Farrell, Albany, NY (US); Gerard M. Schmid, Rensselaer, NY (US); xU Ji, San Jose, CA (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 14 days.

(21) Appl. No.: 13/841,694

(22) Filed: Mar. 15, 2013

(51) Int. Cl.
  *H01L 21/31*  (2006.01)
  *H01L 21/469* (2006.01)
  *H01L 21/033* (2006.01)

(52) U.S. Cl.
  CPC .................................. *H01L 21/0337* (2013.01)
  USPC .... 438/780; 438/311; 438/636; 257/E21.006; 257/E21.007; 257/E21.027; 257/E21.077; 257/E21.058; 257/E21.267; 257/E21.32; 257/E21.266; 257/E21.329

(58) Field of Classification Search
  USPC ............. 438/780, 311, 636, 9, 745, 779, 792, 438/795, 753, 663, 662; 257/E21.006, 257/E21.007, E21.027, E21.077, E21.058, 257/E21.267, E21.32, E21.266, E21.329
  See application file for complete search history.

(56) References Cited

U.S. PATENT DOCUMENTS

| | | | |
|---|---|---|---|
| 7,237,221 B2 * | 6/2007 | Granik et al. | 716/52 |
| 8,114,573 B2 * | 2/2012 | Sandhu et al. | 430/270.1 |
| 8,222,154 B2 * | 7/2012 | Doris et al. | 438/705 |
| 8,287,749 B2 * | 10/2012 | Hasegawa et al. | 216/41 |
| 8,336,003 B2 * | 12/2012 | Cheng et al. | 716/53 |
| 8,574,950 B2 * | 11/2013 | Clevenger et al. | 438/98 |
| 8,667,430 B1 * | 3/2014 | Latypov | 716/51 |
| 2011/0076623 A1 | 3/2011 | Fitrianto et al. | |
| 2012/0207940 A1 | 8/2012 | Muramatsu et al. | |
| 2012/0331428 A1 | 12/2012 | Cheng et al. | |

* cited by examiner

*Primary Examiner* — David Nhu
(74) *Attorney, Agent, or Firm* — Ingrassia Fisher & Lorenz, P.C.

(57) ABSTRACT

Methods for creating chemical guide patterns by DSA lithography for fabricating an integrated circuit are provided. In one example, an integrated circuit includes forming a bifunctional brush layer of a polymeric material overlying an anti-reflective coating on a semiconductor substrate. The polymeric material has a neutral polymeric block portion and a pinning polymeric block portion that are coupled together. The bifunctional brush layer includes a neutral layer that is formed of the neutral polymeric block portion and a pinning layer that is formed of the pinning polymeric block portion. A portion of the neutral layer or the pinning layer is selectively removed to define a chemical guide pattern. A block copolymer layer is deposited overlying the chemical guide pattern. The block copolymer layer is phase separated to define a nanopattern that is registered to the chemical guide pattern.

20 Claims, 12 Drawing Sheets

METHODS FOR FABRICATING INTEGRATED CIRCUITS INCLUDING FORMATION OF CHEMICAL GUIDE PATTERNS FOR DIRECTED SELF-ASSEMBLY LITHOGRAPHY

TECHNICAL FIELD

The technical field relates generally to methods for fabricating integrated circuits, and more particularly relates to methods for fabricating integrated circuits including formation of chemical guide patterns for directed self-assembly lithography.

BACKGROUND

Decreasing device size and increasing device density has traditionally been a high priority for the manufacturing of the integrated circuits. Optical lithography has been the driving force for device scaling. Conventional optical lithography is limited to about 80 nm pitch for single exposure patterning whilst double and other multi-patterning processes can realize smaller pitch, these approaches are expensive and more complex.

Directed self-assembly (DSA), a technique which aligns self-assembling polymeric materials on a lithographically defined guide pattern, is a potential option for extending current optical lithography beyond its pitch and resolution limits. The self-assembling materials, for example, are block copolymers (BCPs) which consist of "A" homopolymer covalently attached to "B" homopolymer, which are coated over a lithographically defined guide pattern on a semiconductor substrate. The lithographically defined guide pattern is a pre-pattern that is encoded with spatial chemical and/or topographical information and serves to direct the self-assembly process and the pattern formed by the self-assembling materials. Subsequently, by annealing the DSA polymers, the A polymer chains and the B polymer chains undergo phase separation to form an A polymer region and a B polymer region that are registered to the underlying guide pattern. Then, by removing either the A polymer block or the B polymer block by wet chemical or plasma-etch techniques, a mask is formed for transferring the nanopattern to the underlying substrate. Unfortunately, current processes for forming chemical guide patterns for DSA are complicated, costly, and/or not practical for large scale manufacturing.

Accordingly, it is desirable to provide methods for fabricating integrated circuits including formation of chemical guide patterns for directed self-assembly lithography with reduced complexity and cost and that are practical for large scale manufacturing. Furthermore, other desirable features and characteristics of the present invention will become apparent from the subsequent detailed description and the appended claims, taken in conjunction with the accompanying drawings and this background.

BRIEF SUMMARY

Methods for fabricating integrated circuits are provided herein. In accordance with an exemplary embodiment, a method for fabricating an integrated circuit includes forming a bifunctional brush layer of a polymeric material overlying an anti-reflective coating on a semiconductor substrate. The polymeric material has a neutral polymeric block portion and a pinning (non-neutral) polymeric block portion that are covalently bonded together. The bifunctional brush layer includes a neutral layer that is formed of the neutral polymeric block portion and a pinning layer that is formed of the pinning polymeric block portion. A portion of the neutral layer or the pinning layer is selectively removed to define a chemical guide pattern. A block copolymer layer is deposited overlying the chemical guide pattern. The block copolymer layer is phase separated to define a nanopattern that is registered to the chemical guide pattern.

In accordance with another exemplary embodiment, a method for fabricating an integrated circuit is provided. The method includes forming a bifunctional brush layer of a polymeric material overlying an anti-reflective coating on a semiconductor substrate. The bifunctional brush layer is formed such that a pinning layer of the bifunctional brush layer is disposed adjacent to the anti-reflective coating and a neutral layer of the bifunctional brush layer is disposed adjacent to the pinning layer on a side opposite the anti-reflective coating. The polymeric material includes a neutral polymeric block portion and a pinning polymeric block portion that form the neutral layer and the pinning layer, respectively. A portion of the neutral layer is selectively removed to define a chemical guide pattern. A block copolymer layer is deposited overlying the chemical guide pattern. The block copolymer layer is phase separated to define a nanopattern that is registered to the chemical guide pattern.

In accordance with another exemplary embodiment, a method for fabricating an integrated circuit is provided. The method includes forming a bifunctional brush layer of a polymeric material overlying an anti-reflective coating on a semiconductor substrate. The bifunctional brush layer is formed such that a neutral layer of the bifunctional brush layer is disposed adjacent to the anti-reflective coating and a pinning layer of the bifunctional brush layer is disposed adjacent to the neutral layer on a side opposite the anti-reflective coating. The polymeric material includes a neutral polymeric block portion and a pinning polymeric block portion that form the neutral layer and the pinning layer, respectively. A portion of the pinning layer is selectively removed to define a chemical guide pattern. A block copolymer layer is deposited overlying the chemical guide pattern. The block copolymer layer is phase separated to define a nanopattern that is registered to the chemical guide pattern.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
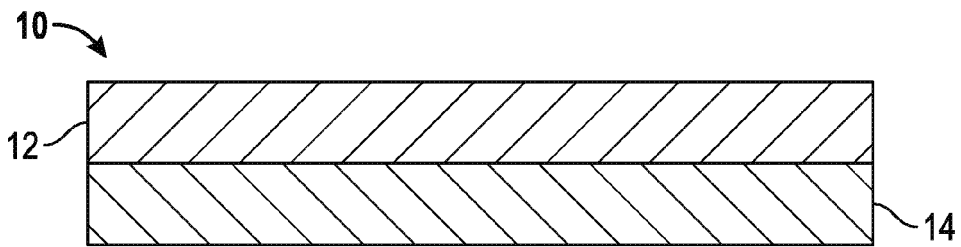
FIGS. 1-8 illustrate, in cross-sectional views, fabrication of the chemical guide pattern and a method for forming this structure during intermediate stages of its fabrication in accordance with an exemplary embodiment.

The following Detailed Description is merely exemplary in nature and is not intended to limit the various embodiments or the application and uses thereof. Furthermore, there is no intention to be bound by any theory presented in the preceding background or the following detailed description.

Various embodiments described herein relate to methods for fabricating integrated circuits. The exemplary embodiments taught herein form a bifunctional brush layer of a polymeric material overlying an anti-reflective coating on a semiconductor substrate. The polymeric material includes polymer chains each having a neutral polymeric block and a pinning polymeric block that is coupled to an end of the neutral polymeric block. The neutral polymeric blocks together form the neutral polymeric block portion of the polymeric material and the pinning polymeric blocks together form the pinning polymeric block portion of the polymeric material. In an exemplary embodiment, the neutral polymeric blocks are random copolymers that have no preferential affinity for the individual polymeric block components of a block copolymer layer that will be subsequently deposited over the polymeric material as part of a DSA process. In an exemplary embodiment, the pinning polymeric blocks are polymers with functionality to facilitate preferential interaction (pinning) with one of the components of the polymeric material of the subsequently deposited block copolymer layer. The polymer chains that form the bifunctional brush layer are chemically attached (grafted) at one end to the anti-reflective coating by incorporating additional functionality, for example monohydroxy moieties or cyclic ethers, within the pinning brush polymeric block.

A portion of the neutral layer or the pinning layer is selectively removed, e.g., using acid scissioning or ultraviolet (UV) lithography or electron beam lithography (EBL), to define a chemical guide pattern. As discussed above, a block copolymer layer is deposited overlying the chemical guide pattern as part of the DSA process. In an exemplary embodiment, the block copolymer layer is heated to a temperature near or above its glass transition temperature (Tg) to phase separate the block copolymer into a first polymeric block portion and a second polymeric block portion. Because the chemical guide pattern has portions that consists of the neutral layer and portions that consists of the pinning layer, various areas of the chemical guide pattern have differing affinities towards the first polymeric block portion and independently towards the second polymeric block portion such that when the block copolymer is phase separated, it forms a nanopattern that is registered to the chemical guide pattern. In an exemplary embodiment, the first or second polymeric block portion is removed to form a mask for transferring the nanopattern to the semiconductor substrate. This exemplary embodiment makes use of a polymeric material that has both a neutral polymeric block portion and a pinning polymeric block portion to create a bifunctional brush layer that can be formed simply from a single layer of the polymeric material to facilitate forming the chemical guide pattern, thereby reducing complexity and cost for large scale manufacturing of the integrated circuits using DSA.

FIGS. 1-24 illustrate methods for fabricating an integrated circuit 10 in accordance with various embodiments. The described process steps, procedures, and materials are to be considered only as exemplary embodiments designed to illustrate to one of ordinary skill in the art methods for practicing the invention; the invention is not limited to these exemplary embodiments. Various steps in the manufacture of integrated circuits are well known and so, in the interest of brevity, many conventional steps will only be mentioned briefly herein or will be omitted entirely without providing the well-known process details.

FIGS. 1-8 illustrate, in cross-sectional views, the integrated circuit 10 during intermediate stages of its fabrication in accordance with an exemplary embodiment. Referring to FIG. 1, the integrated circuit includes an anti-reflective coating 12 disposed on a semiconductor substrate 14. The semiconductor substrate 14 can be, for example, a bulk semiconductor substrate or silicon-on-insulator (SOI) semiconductor substrate as are well known in the art. The anti-reflective coating 12, which is commonly referred to as ARC or BARC (bottom anti-reflective coating), may be a polymer and/or silicon (Si) containing material that is used to absorb and/or control light to dampen or eliminate light reflection during photolithography to improve the photolithography process window for producing smaller features. In one embodiment, the anti-reflective coating 12 is formed of a Si-containing polymer(s) (SiARC) that may be cross-linked. SiARC materials are commercially available from several manufacturers including Shin Etsu Chemical Co., Ltd., which is headquartered in Japan. The anti-reflective coating 12 may be formed by depositing an anti-reflective material onto the semiconductor substrate 14 using a spin coating process, for example, and heating the semiconductor substrate 14 to cross-link the anti-reflective material. In an exemplary embodiment, the semiconductor substrate 14 with the anti-reflective material is heated to a temperature of from about 150° C. to about 350° C. to cross-link the anti-reflective material.

Figure 2A:
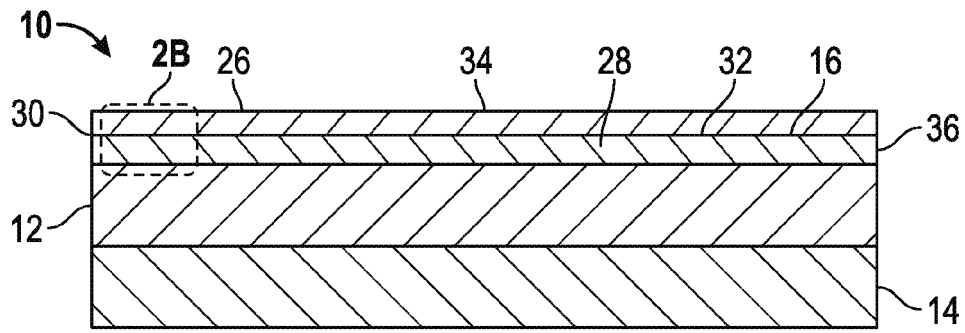
Figure 2C:
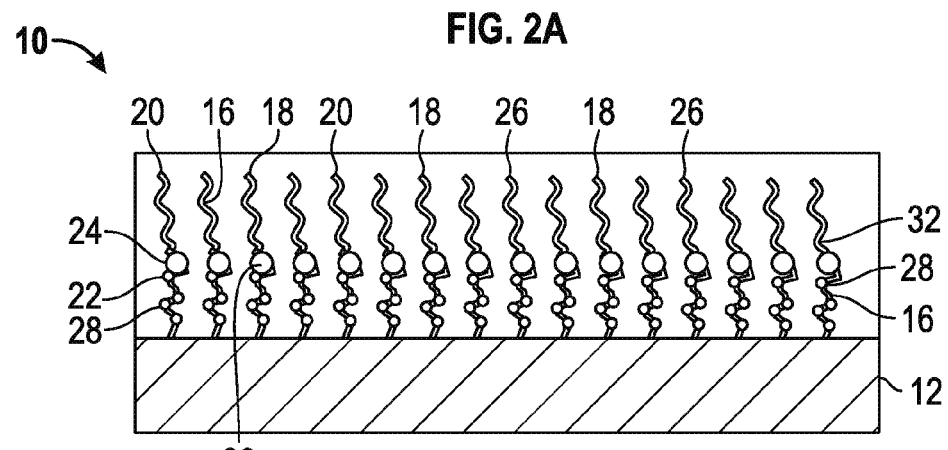
Figure 2B:
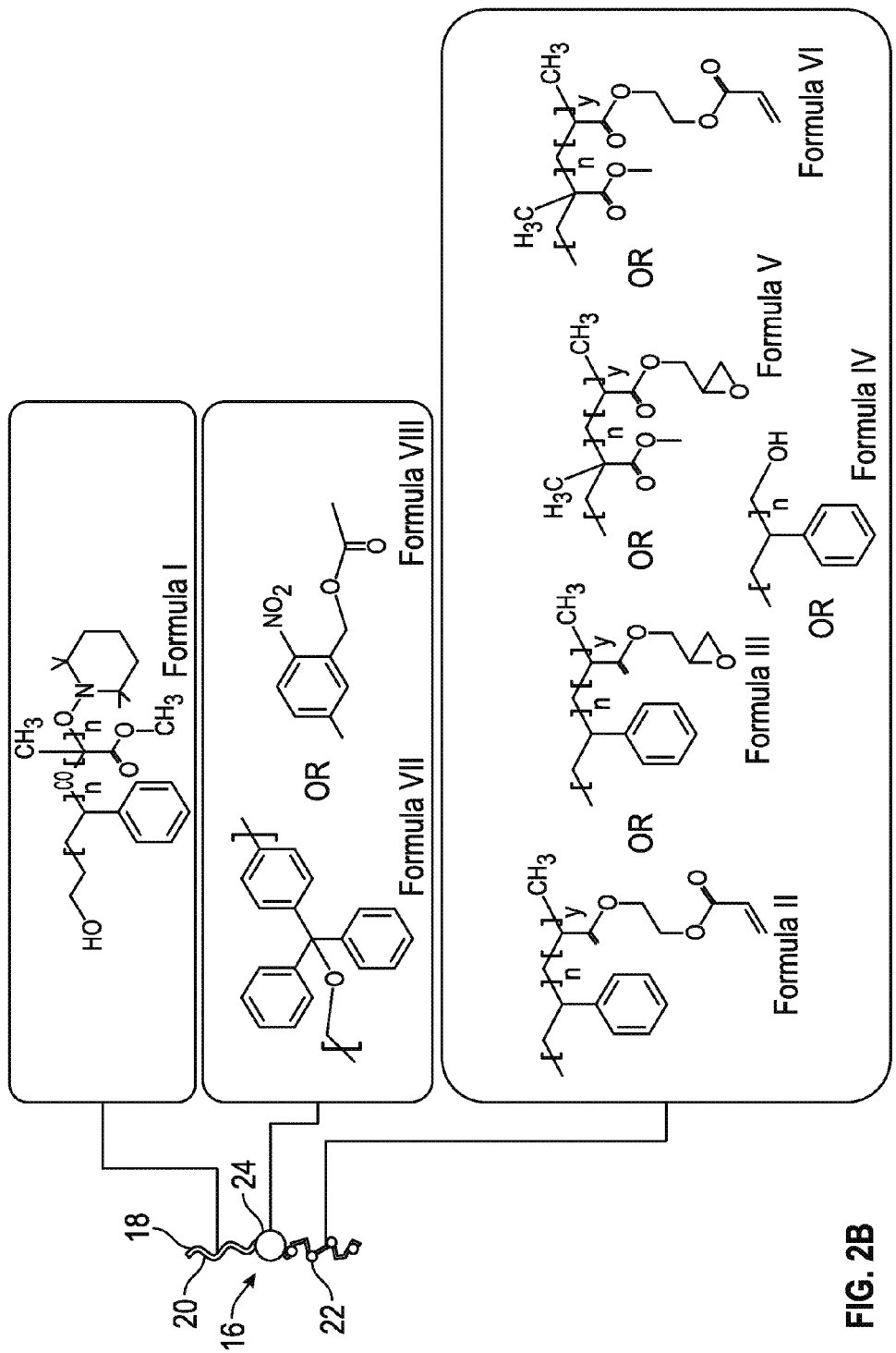

The method continues as illustrated in FIGS. 2A-2C by depositing a polymeric material 16 overlying the anti-reflective coating 12. The polymeric material 16 is deposited onto the anti-reflective coating 12 using, for example, a spin coating process. Other processes known to those skilled in the art may also be used for depositing the polymeric material 16 onto the anti-reflective coating 12.

In an exemplary embodiment, the polymeric material 16 includes a plurality of polymer chains 18 each having a neutral polymeric block 20, a pinning polymeric block 22, and a chemically or photochemically cleavable junction 24 that couples the neutral polymeric block 20 to the pinning polymeric block 22. The neutral polymeric components 20 together form a neutral polymeric block portion 26 of the polymeric material 16, the pinning polymeric components 22 together form a pinning polymeric component portion 28 of the polymeric material 16, and the cleavable junctions 24 together form a cleavable link portion 30 of the polymeric material 16. In an exemplary embodiment, the neutral polymeric block 20 includes a random copolymer of polystyrene and polymethylmethacrylate (e.g., Formula I) with monohydroxy functional groups. In another exemplary embodiment, the pinning polymeric block 22 has chemical cross-linkable functionality and includes styrene (e.g., polystyrene) with hydroxyethyl methacrylate (HEMA) (e.g., Formula II) such as styrene (e.g., polystyrene) with about 1 to about 3 mole % (mol. %) of HEMA, for example about 2 mol. % of HEMA, styrene (e.g., polystyrene) with glycol methacrylate (GMA) (e.g., Formula III) such as styrene (e.g., polystyrene) with about 1 to about 3 mol. % of GMA, for example about 2 mol. % of GMA, polystyrene with a terminal hydroxyl moiety (e.g., Formula IV), methylmethacrylate with HEMA (e.g., Formula V) such as methylmethacrylate with about 1 to about 3 mol. % of HEMA, for example about 2 mol. % of HEMA, and/or methylmethacrylate with GMA (e.g., Formula VI) such as methylmethacrylate with about 1 to about 3 mol. % of GMA, for example about 2 mol. % of GMA. In another exemplary embodiment, the cleavable link includes trityl ether (e.g., Formula VII) and/or nitro benzyl ether (e.g., Formula VIII).

In an exemplary embodiment, the polymeric material 16 is heated at a predetermined temperature for a predetermined time to at least partially cross-link the pinning polymeric block portion 28 (e.g., via the HEMA moieties or the GMA moieties) and form a bifunctional brush layer 32 that is coupled, affixed, and/or otherwise attached to the anti-reflective coating 12. In one example, the polymeric material 16 is heated to a temperature of from about 200 to about 350° C. for a time of from about 60 to about 600 seconds.

Figure 3:
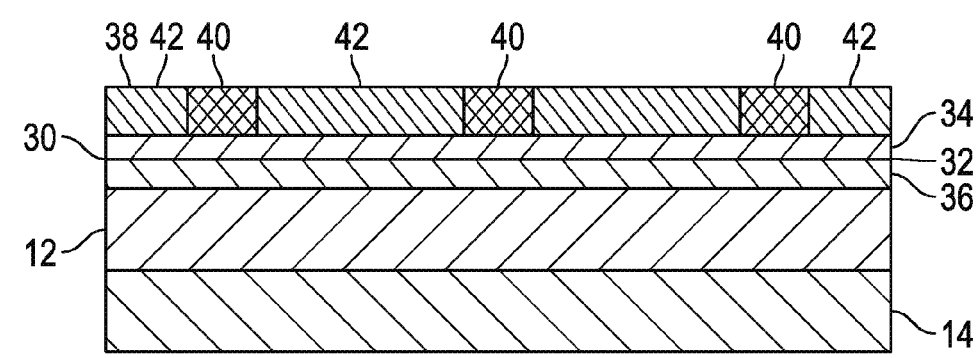

FIG. 3 illustrates the bifunctional brush layer 32 including the polymer chains 18 that are coupled to surface of the anti-reflective coating 12. The bifunctional brush layer 32 has a neutral layer 34 that is formed of the neutral polymeric block portion 26 and a pinning layer 36 that is formed of the pinning polymeric block portion 28. The pinning layer 36 is disposed adjacent to the anti-reflective coating 12 and the neutral layer 34 is coupled to the pinning layer 36 on a side opposite the anti-reflective coating 12 via the cleavable link portion 30.

As illustrated, a photoresist layer 38 is deposited overlying the bifunctional brush layer 32 and is patterned using lithographic techniques to form an exposed photoresist portion 40 and an unexposed photoresist portion 42. In an exemplary embodiment, ultraviolet light (e.g., from a lithographical process including an ultraviolet light source) is used to pattern the photoresist layer 38. In one example, the photoresist layer 38 is patterned using ultraviolet light at a wavelength of about 193 nm with an exposure dose of about 5 to about 40 mJ/cm$^2$, for example about 20 mJ/cm$^2$.

Figure 4:
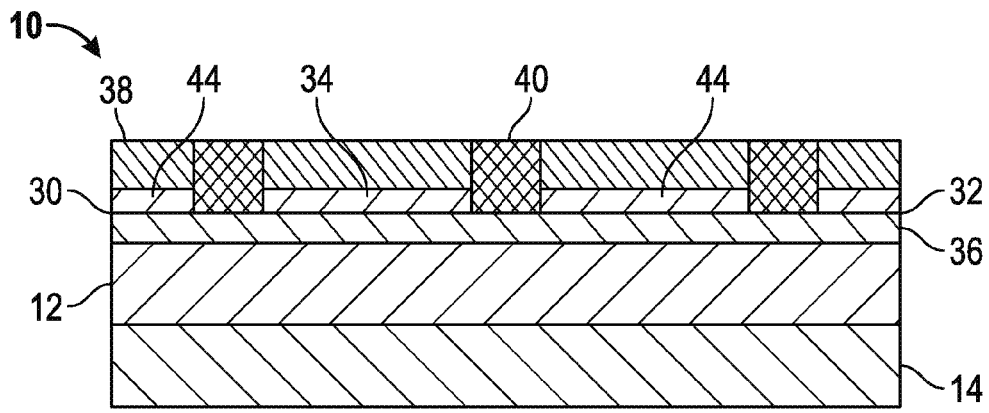

As illustrated in FIG. 4, portions of the neutral layer 34 are selectively cleaved (e.g., separated, scissioned, removed, or the like) from and/or during patterning the photoresist layer 38, leaving remaining portions 44 of the neutral layer 34 spaced apart from each other and intermittently disposed overlying the pinning layer 36. In an exemplary embodiment, the cleavable link portion 30 is cleaved by exposure to ultraviolet light. In one example, the cleavable link portion 30 is nitro benzyl ether, which is an ultraviolet responsive junction that is cleaved by exposure to ultraviolet light. As such, patterning the photoresist layer 38 with ultraviolet light causes scissioning of the portions of the neutral layer 34 from the pinning layer 36 in areas where the cleavable link portion 30 is selectively exposed to ultraviolet light. In another embodiment, the photoresist layer 38 is a chemically amplified photoresist layer that forms an acid when exposed to ultraviolet light and the cleavable link portion 30 is cleaved by exposure to the acid. In one example, the cleavable link portion 30 is trityl ether, which is an acid responsive junction that is cleaved by exposure to acid. Chemically amplified (CA) photoresist materials are well known and are commercially available from JSR Micro Inc. and Shin-Etsu Chemical Co., Ltd. After the post exposure bake, the photoacid generators (PAG) within the CA photoresists decompose to produce photoacid species. These acid species cleave deprotection groups within the CA photoresist, changing the solubility of the exposed region, which can then be removed in a development step. In an exemplary embodiment, the chemically amplified photoresist layer is heated to a temperature of from about 90 to about 130° C. contemporaneously with or subsequent to patterning the chemically amplified photoresist layer to facilitate forming the acid.

Figure 5A:
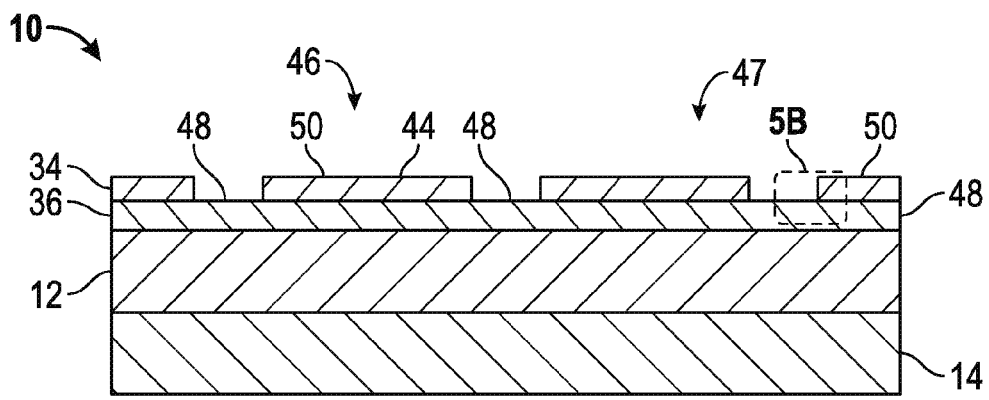
Figure 5B:
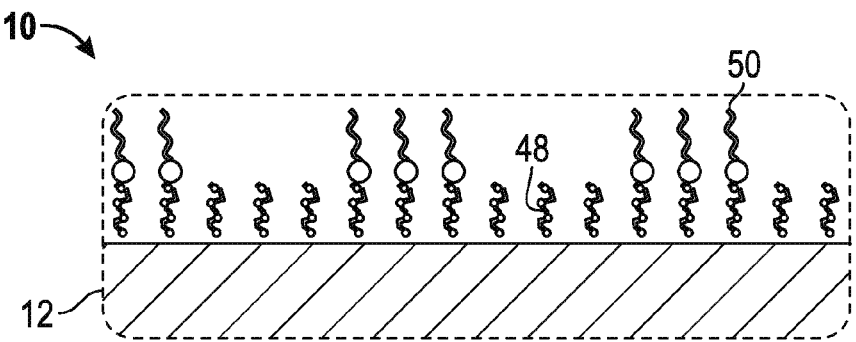

FIGS. 5A-5B illustrate, in cross-sectional views, the integrated circuit 10 during a later fabrication stage in accordance with an exemplary embodiment. The exposed and unexposed photoresist portions 40 and 42 and the portions of the neutral layer 34 (see FIGS. 3-4) that have been cleaved are removed from the semiconductor substrate 14 with a solvent to expose a chemical guide pattern 46. In an exemplary embodiment, the solvent is an organic solvent such as propylene glycol methyl ether acetate (PGMEA), 4-Methyl-2-pentanol (4M2P), n-Butyl acetate (nBA), gamma-Butyrolactone (GBA), toluene, acetone, and/or the like. As illustrated, the chemical guide pattern 46 is a recessed topographical chemical guide pattern 47 that has recessed pinning guide features 48 defined by the exposed portion of the pinning layer 36 and protruding neutral fields 50 defined by the remaining portion 44 of the neutral layer 34.

Figure 6:
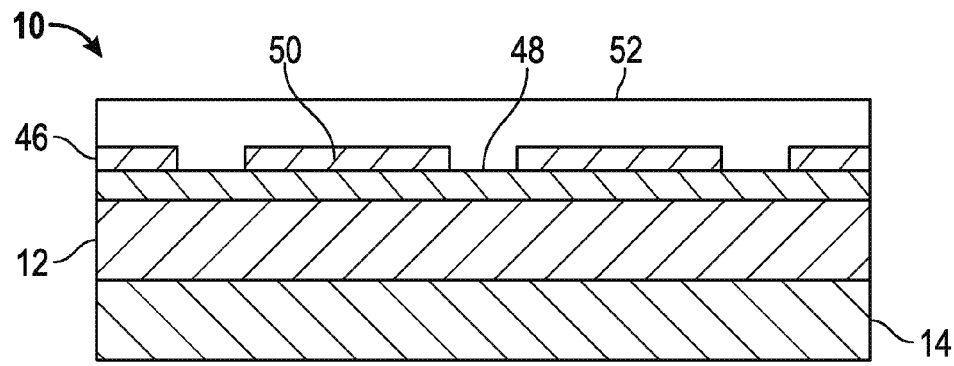
Figure 7:
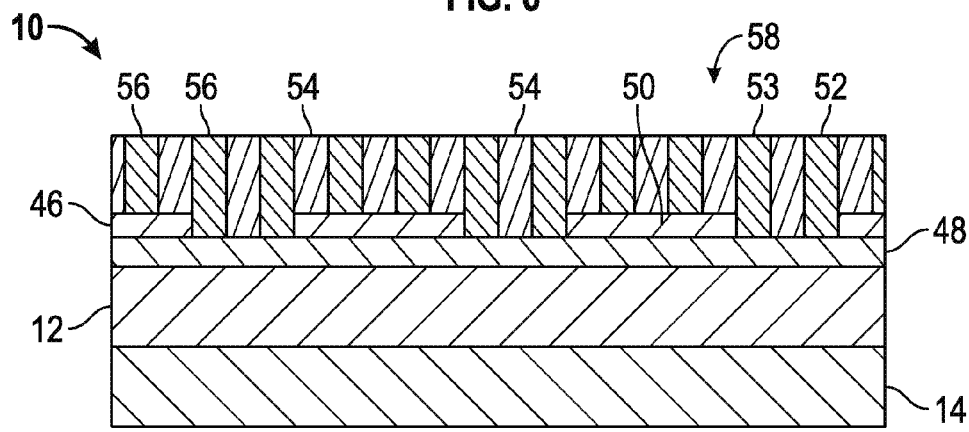
Figure 8:
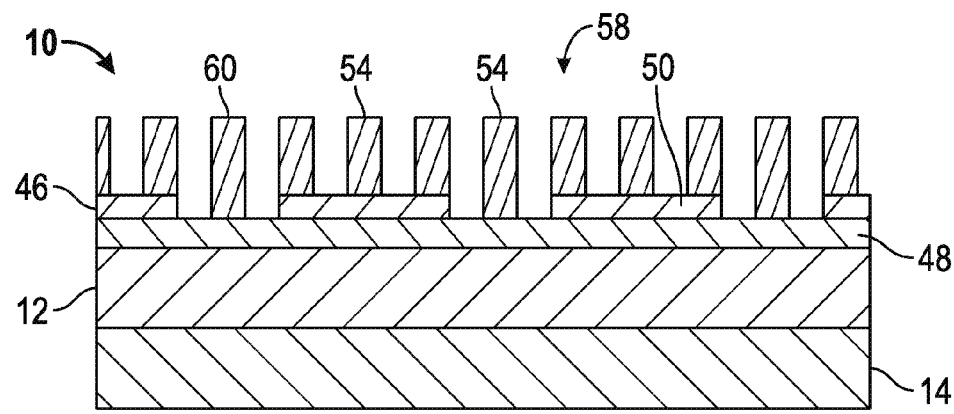

FIGS. 6-8 illustrate, in cross-sectional views, the integrated circuit 10 during later fabrication stages in accordance with an exemplary embodiment. The method continues by depositing a block copolymer layer 52 overlying the chemical guide pattern 46. The block copolymer layer 52 may be deposited, for example, using a spin coating process or the like. The block copolymer layer 52 has A polymer blocks and B polymer blocks. In an exemplary embodiment, the block copolymer layer 52 is a block copolymer of polystyrene that forms the A polymer blocks and polymethylmethacrylate that forms the B polymer blocks. As shown in FIG. 8, the pinning layer acts to guide the polystyrene component of the block copolymer. In another embodiment, the pinning layer could also be PMMA based.

The block copolymer layer 52 is heated at a predetermined temperature for a predetermined time to phase separate the block copolymer layer 52 and form a phase separated block copolymer 53. The phase separated block copolymer 53 has A polymer block regions 54 formed from the A polymer blocks and B polymer block regions 56 formed from the B polymer blocks. In an exemplary embodiment, the recessed pinning guide features 48 and the protruding neutral fields 50 of the chemical guide pattern 46 have different affinities towards the A polymer blocks and independently towards the B polymer blocks of the block copolymer layer 52. As such, when the block copolymer layer 52 phase separates, the A polymer block regions 54 and the B polymer block regions 56 are registered to the chemical guide pattern 46 so as to produce a nanopattern 58. In an exemplary embodiment, the block copolymer layer 52 is heated at a temperature of from about 200 to about 350° C. for about 60 to about 600 seconds in a nitrogen-rich ($N_2$) atmosphere. In an exemplary embodiment, the nanopattern 58 allows for resolution in the nanometer range beyond that of conventional optical lithography techniques.

The method continues as illustrated in FIG. 8 by removing the B polymer block regions 56. As illustrated, the remaining A polymer block regions 54 defines a mask 60 for transferring the nanopattern 58 to the semiconductor substrate 14. In an exemplary embodiment, the B polymer block regions 56 are polymethylmethacrylate and are removed by exposing the phase separated block copolymer 53 (see FIG. 7) to a dry etching process, such as reactive-ion etching (RIE) plasma. The nanopattern 58 can be transferred to the semiconductor substrate 14 to form device features, for example, using the mask 60 and a conventional wet or dry etching process.

Figure 9:
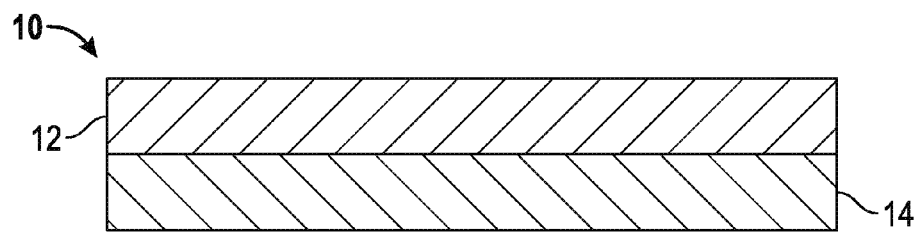
FIGS. 9-16 illustrate, in cross-sectional views, fabrication of the chemical guide pattern and a method for forming this structure during intermediate stages of its fabrication in accordance with another exemplary embodiment.
Figure 10A:
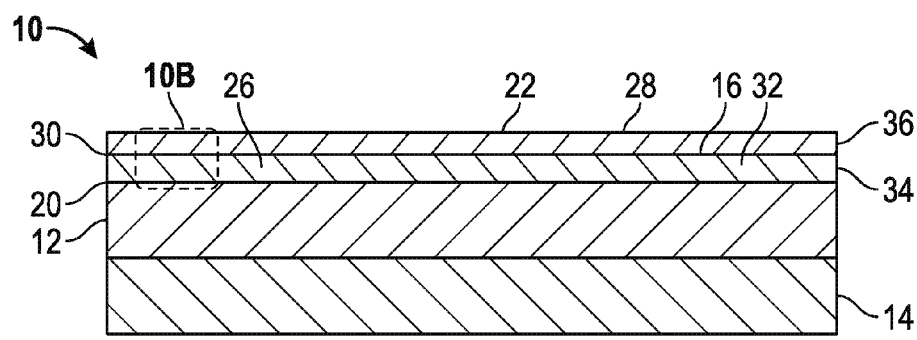
Figure 10C:
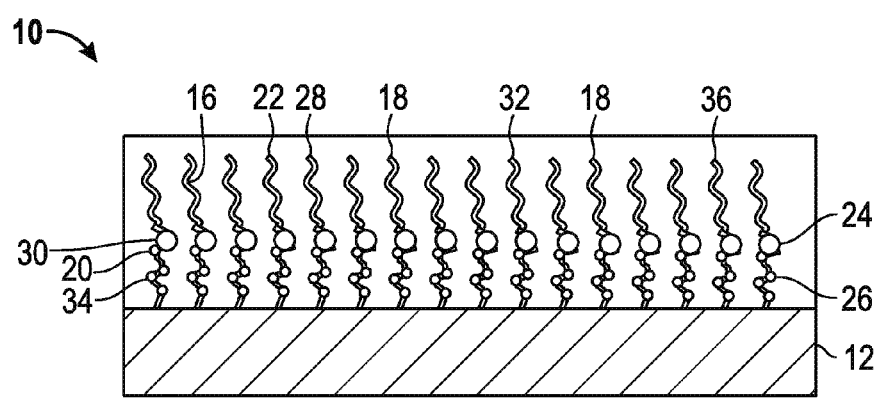
Figure 10B:
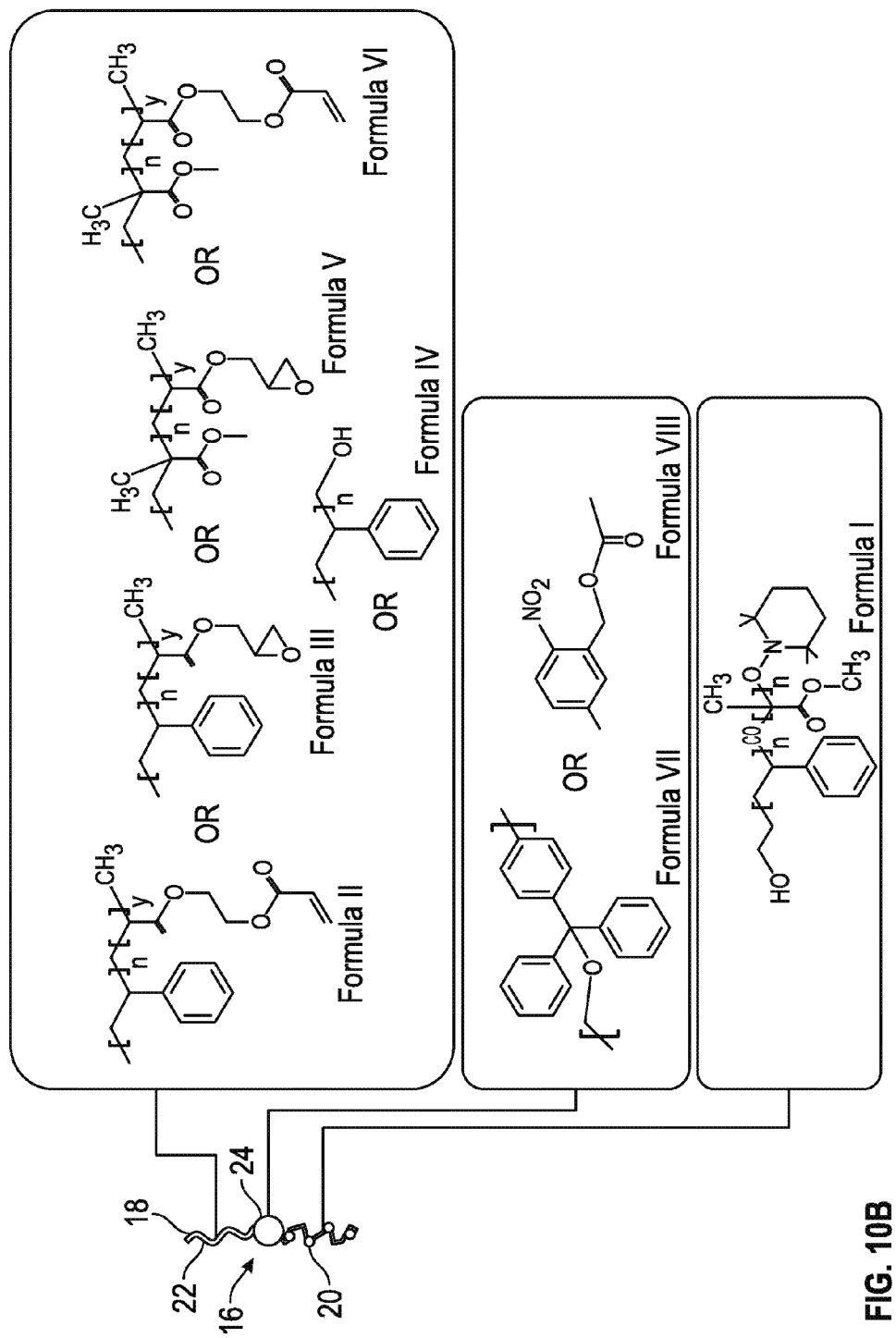

FIGS. 9-16 illustrate, in cross-sectional views, the integrated circuit 10 during intermediate stages of its fabrication in accordance with another exemplary embodiment. Referring to FIGS. 9-10C, the bifunctional brush layer 32 of the polymeric material 16 is formed overlying the anti-reflective coating 12 including depositing and heating of the polymeric material 16 similarly as described above in relation to FIGS. 1-2C except that the neutral layer 34 is disposed adjacent to the anti-reflective coating 12 and the pinning layer 36 is coupled to the neutral layer 34 on a side opposite the anti-reflective coating 12 via the cleavable link portion 30.

Figure 11:
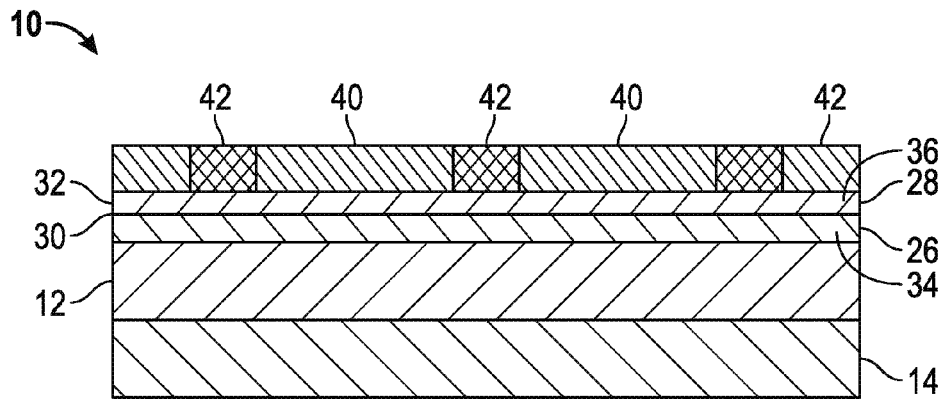
Figure 12:
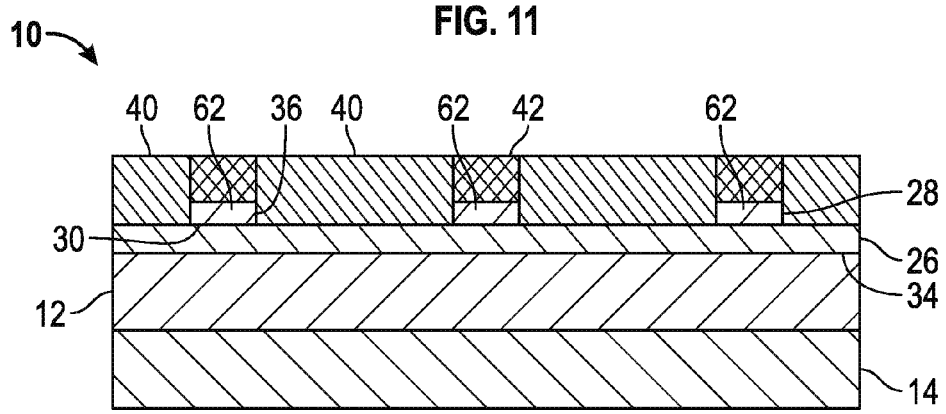

FIG. 11 illustrates, in cross-sectional view, the integrated circuit 10 during a later fabrication stage in accordance with an exemplary embodiment. The photoresist layer 38 is deposited overlying the bifunctional brush layer 32 and is patterned as described above in relation to FIG. 3 to form the exposed photoresist portion 40 and the unexposed photoresist portion 42. As illustrated in FIG. 12, portions of the pinning layer 36 are selectively cleaved (e.g., separated, scissioned, removed, or the like) from and/or during patterning the photoresist layer 38, leaving remaining portions 62 of the pinning layer 36 spaced apart from each other and intermittently disposed overlying the neutral layer 34. In an exemplary embodiment, the cleavable link portion 30 is cleaved by exposure to ultraviolet light. In one example, the cleavable link portion 30 is nitro benzyl ether and is cleaved by exposure to ultraviolet light. As such, patterning the photoresist layer 38 with ultraviolet light causes scissioning of the portions of the pinning layer 36 from the neutral layer 34 in areas where the cleavable link portion 30 is selectively exposed to ultraviolet light. In another embodiment, the photoresist layer 38 is a chemically amplified photoresist layer and the cleavable link portion 30 is trityl ether that is cleaved by exposure to acid produced from the chemically amplified photoresist layer during ultraviolet light exposure. In an exemplary embodiment, the chemically amplified photoresist layer is heated to a temperature of from about 90 to about 130° C. contemporaneously with or subsequent to patterning the chemically amplified photoresist layer to facilitate forming the acid.

Figure 13A:
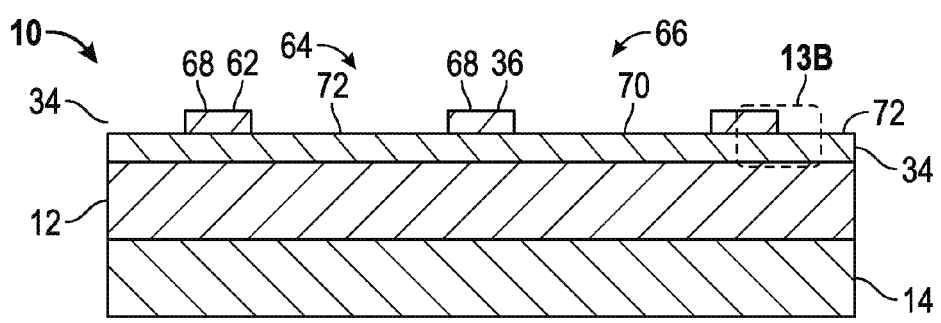
Figure 13B:
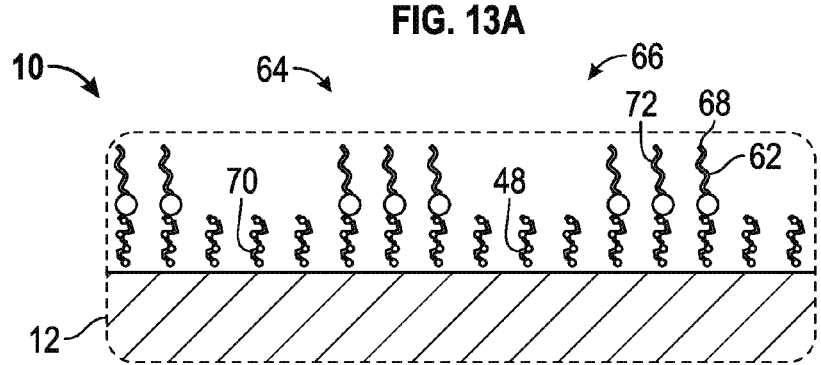

FIGS. 13A-13B illustrate, in cross-sectional views, the integrated circuit 10 during a later fabrication stage in accordance with an exemplary embodiment. The exposed and unexposed photoresist portions 40 and 42 and the portions of the pinning layer 36 (see FIGS. 11-12) that have been cleaved are removed from the semiconductor substrate 14 with a solvent to expose a chemical guide pattern 64. The solvent is an organic solvent such as propylene glycol methyl ether acetate (PGMEA), 4-Methyl-2-pentanol (4M2P), n-Butyl acetate (nBA), gamma-Butyrolactone (GBA), toluene, acetone, and/or the like. As illustrated, the chemical guide pattern 64 is a protruding topographical chemical guide pattern 66 that has protruding pinning guide features 68 defined by the remaining portions 62 of the pinning layer 36 and recessed neutral fields 70 defined by the exposed portion 72 of the neutral layer 34.

Figure 14:
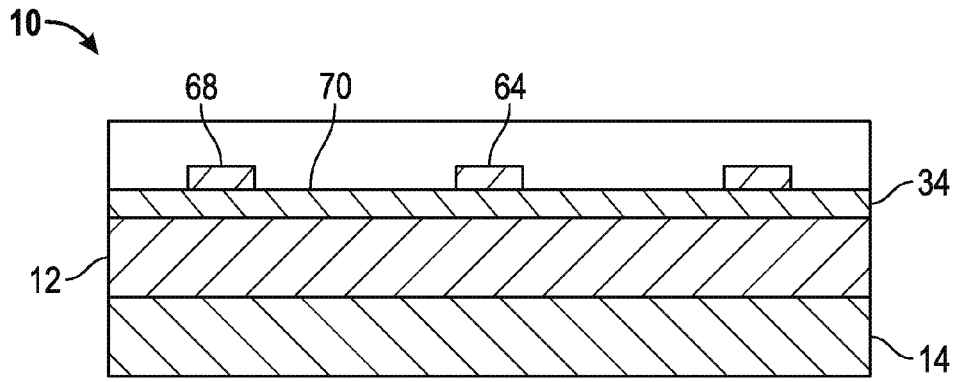
Figure 15:
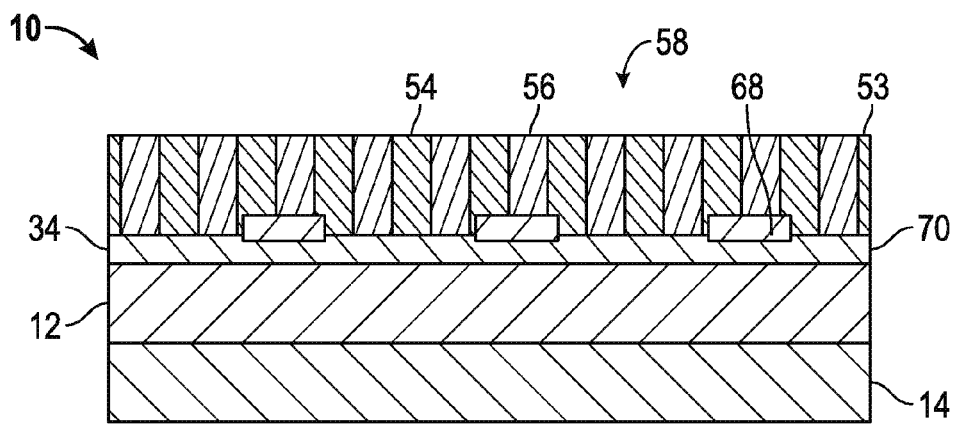
Figure 16:
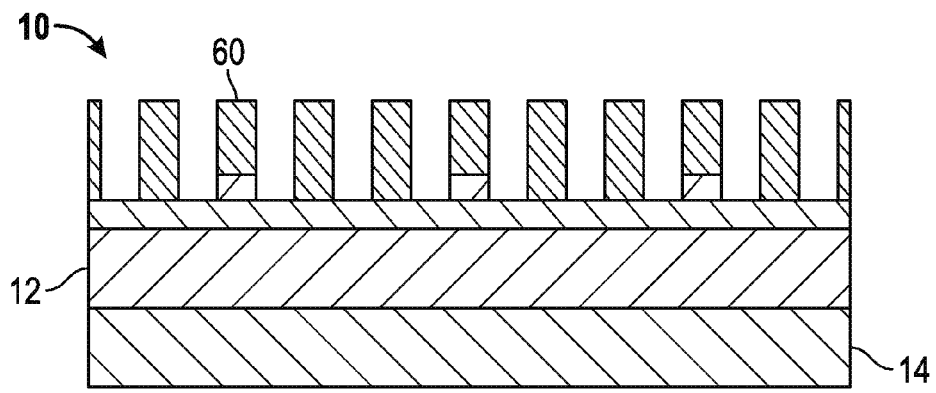

FIGS. 14-16 illustrate, in cross-sectional views, the integrated circuit 10 during later fabrication stages in accordance with an exemplary embodiment. The method continues by depositing the block copolymer layer 52 as described above in relation to FIG. 6 overlying the chemical guide pattern 64. The block copolymer layer 52 is heated to phase separate the block copolymer layer 52 and form the phase separated block copolymer 53. The phase separated block copolymer 53 has A polymer block regions 54 formed from the A polymer blocks and B polymer block regions 56 formed from the B polymer blocks. In an exemplary embodiment, the protruding pinning guide features 68 and the recessed neutral fields 70 of the chemical guide pattern 64 have different affinities towards the A polymer blocks and independently towards the B polymer blocks of the block copolymer layer 52. As such, when the block copolymer layer 52 phase separates, the A polymer block regions 54 and the B polymer block regions 56 are registered to the chemical guide pattern 64 so as to produce the nanopattern 58. In an exemplary embodiment, the block copolymer layer 52 is heated at a temperature of from about 200 to about 350° C. for about 60 to about 600 seconds in a nitrogen-rich ($N_2$) atmosphere.

The method continues as illustrated in FIG. 16 by removing the B polymer block regions 56 as discussed above in relation to FIG. 8. As illustrated, the remaining A polymer block regions 54 defines the mask 60 for transferring the nanopattern 58 to the semiconductor substrate 14 in a conventional manner.

Figure 17:
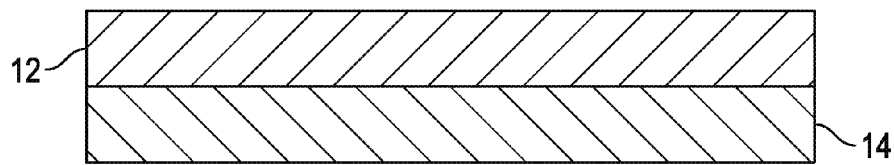
FIGS. 17-24 illustrate, in cross-sectional views, fabrication of the chemical guide pattern and a method for forming this structure during intermediate stages of its fabrication in accordance with another exemplary embodiment.
Figure 18A:
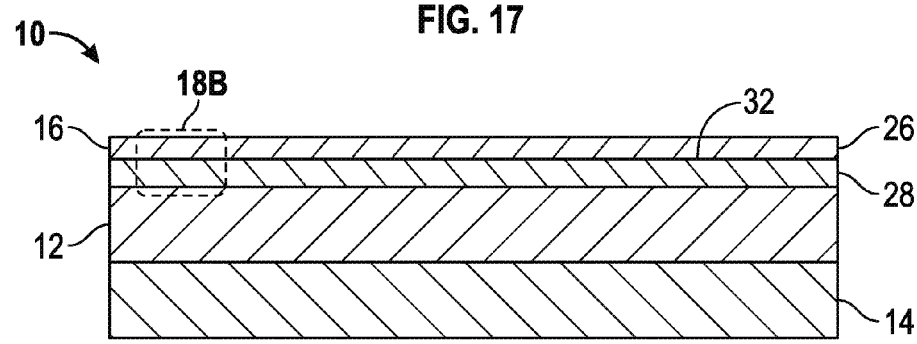
Figure 18C:
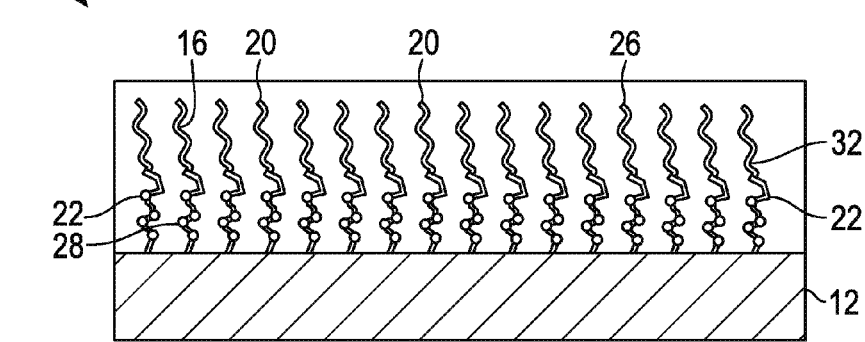
Figure 18B:
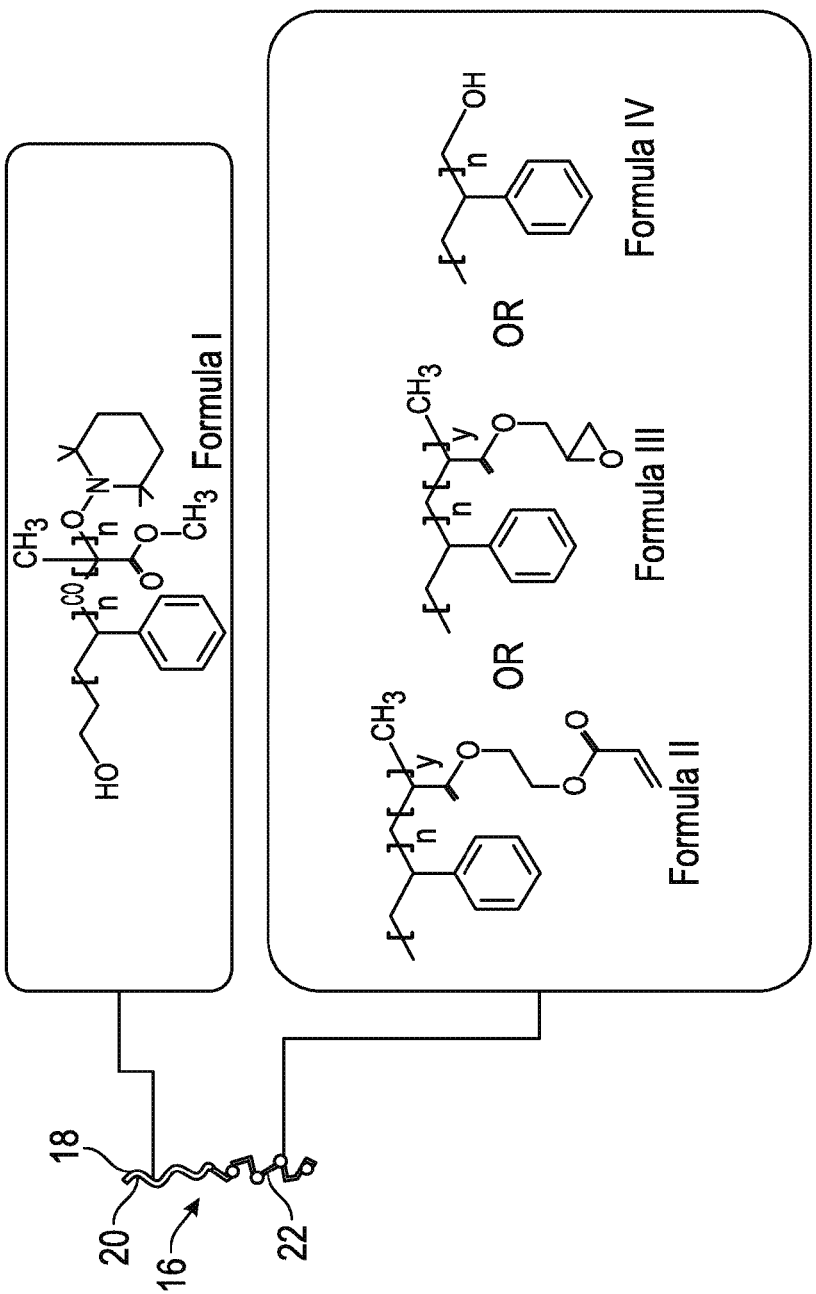

FIGS. 17-24 illustrate, in cross-sectional views, the integrated circuit 10 during intermediate stages of its fabrication in accordance with a further exemplary embodiment. Referring to FIGS. 17-18C, the bifunctional brush layer 32 is formed overlying the anti-reflective coating 12 including depositing and heating of the polymeric material 16 similarly as described above in relation to FIGS. 1-2C with the exception that the polymer chains 18 of the polymeric material 16 each have the neutral polymeric block 20 coupled directly to the pinning polymeric block 22. As such, the neutral polymeric components 20 together form the neutral polymeric block portion 26 of the polymeric material 16 and the pinning polymeric components 22 together form the pinning polymeric block portion 28 of the polymeric material 16 without a cleavable link portion 30 (see FIGS. 2A-2C). In an exemplary embodiment, the neutral polymeric block 20 includes a random copolymer of polystyrene and polymethylmethacrylate (e.g., Formula I) and the pinning polymeric block 22 does not include polymethylmethacrylate. Rather, for example, the pinning polymeric block 22 includes polystyrene with HEMA (e.g., Formula II), polystyrene with GMA (e.g., Formula III), and/or polystyrene with a terminal hydroxyl moiety (e.g., Formula IV).

Figure 19:
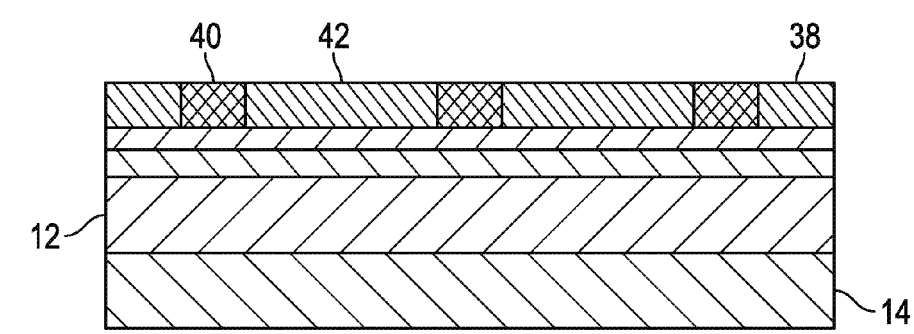

FIG. 19 illustrates, in cross-sectional view, the integrated circuit 10 during a later fabrication stage in accordance with an exemplary embodiment. In an exemplary embodiment, a photoresist layer 38 is deposited overlying the bifunctional brush layer 32 and is patterned using electron beam lithography (ELB) to form the exposed photoresist portion 40 and the unexposed photoresist portion 42.

Figure 20:
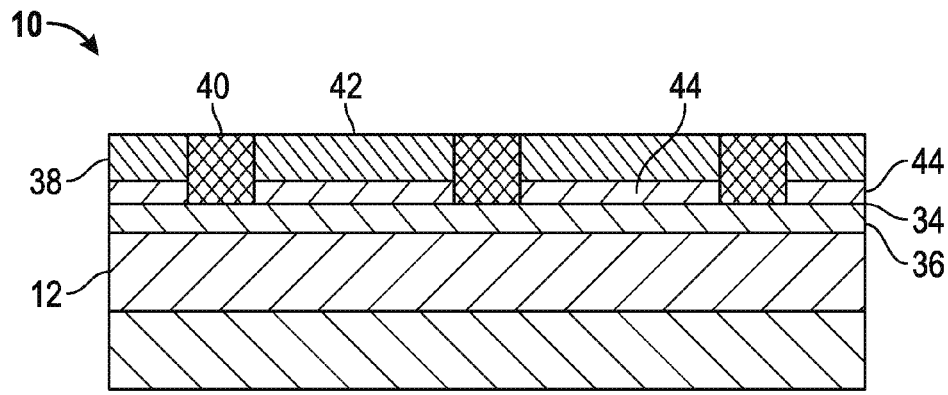
Figure 21A:
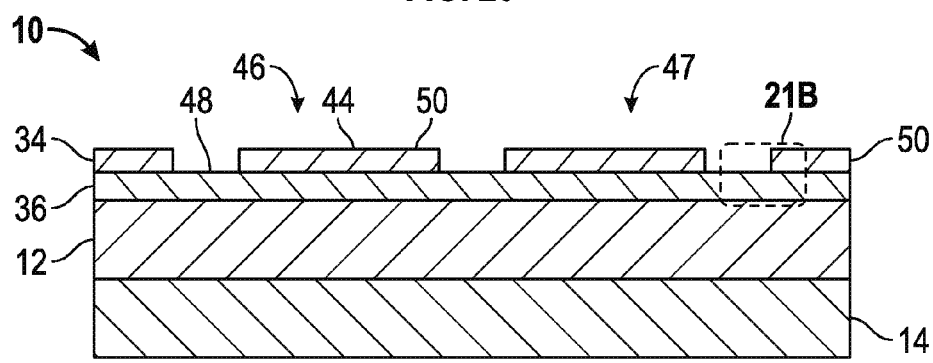
Figure 21B:
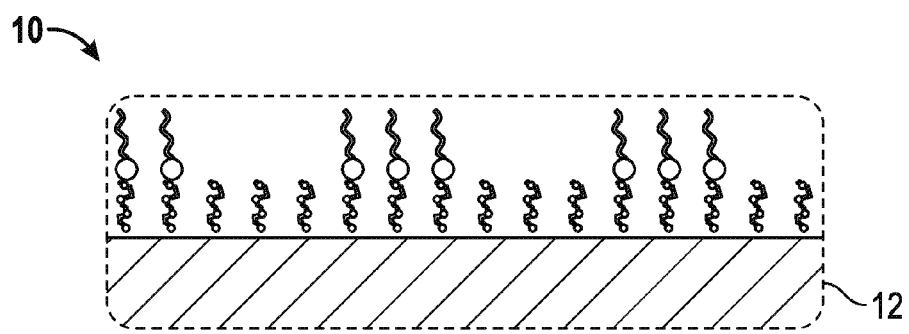
Figure 22:
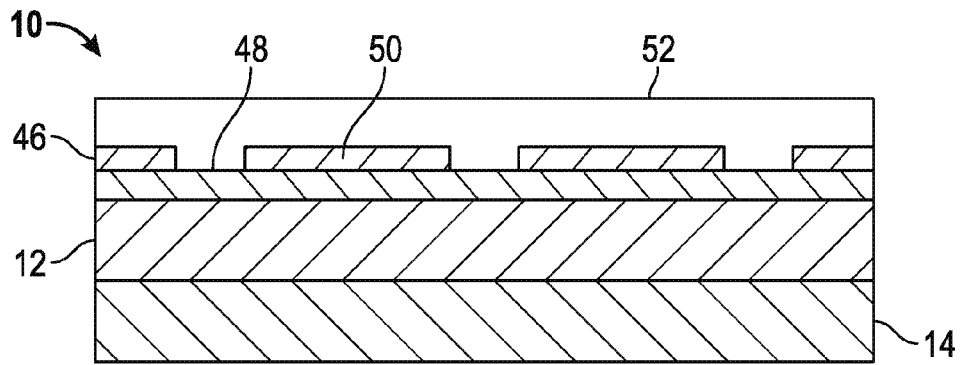
Figure 23:
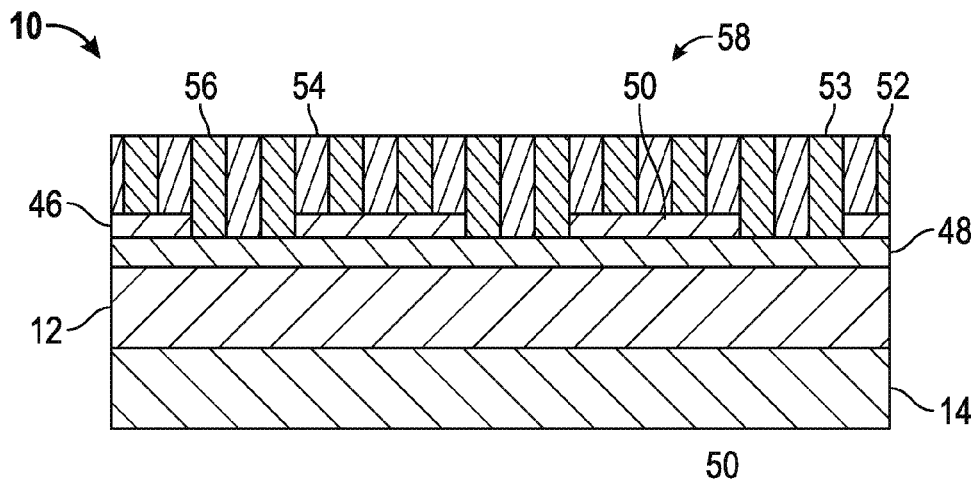
Figure 24:
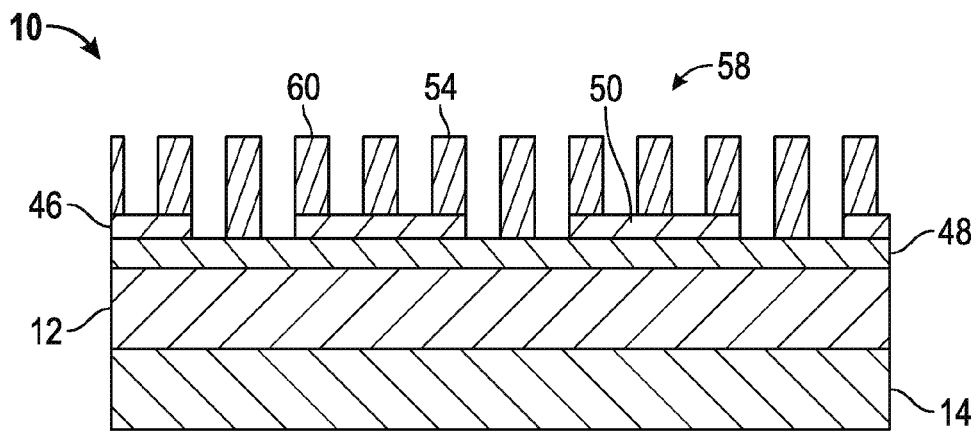

As illustrated in FIG. 20, portions of the neutral layer 34 are selectively removed during patterning of the photoresist layer 38, leaving the remaining portion 44 of the neutral layer 34 spaced apart from each other and intermittently disposed overlying the pinning layer 36. In an exemplary embodiment, the electron beam degrades polymethylmethacrylate contained in the neutral layer 34 and the degraded portions of the neutral layer 34 can be selectively removed while not degrading the pinning layer 36, which does not contain polymethylmethacrylate. The method continues as illustrated in FIGS. 21-24 and as described above in relation to FIGS. 5A-8 to form the mask 60 for transferring the nanopattern 58 to the semiconductor substrate 14.

Accordingly, methods for fabricating integrated circuits have been described. The exemplary embodiments taught herein form a bifunctional brush layer from a polymeric material. The bifunctional brush layer includes a neutral layer and a pinning layer. A portion of the neutral layer or the pinning layer is selectively removed, e.g., using ultraviolet (UV) lithography or electron beam lithography (EBL), to define a chemical guide pattern. A block copolymer layer is deposited overlying the chemical guide pattern as part of a DSA process. In an exemplary embodiment, the block copolymer layer is heated to phase separate the block copolymer into a first polymeric block portion and a second polymeric block portion. Because the chemical guide pattern has portions that are defined by the neutral layer and portions that are defined by the pinning layer, various areas of the chemical guide pattern have differing affinities towards the first polymeric block portion and independently towards the second polymeric block portion such that when the block copolymer is phase separated, it forms a nanopattern that is registered to the chemical guide pattern. The first or second polymeric block portion is removed to form a mask for transferring the nanopattern to the semiconductor substrate.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for creating chemical guide patterns by directed self-assembly (DSA) lithography for fabricating an integrated circuit comprising:
    forming a bifunctional brush layer of a polymeric material overlying an anti-reflective coating on a semiconductor substrate, wherein the polymeric material comprises a neutral polymeric block portion and a pinning polymeric block portion that are coupled together, and wherein the bifunctional brush layer comprises a neutral layer that is formed of the neutral polymeric block portion and a pinning layer that is formed of the pinning polymeric block portion;
    selectively removing a portion of the neutral layer or the pinning layer to define a chemical guide pattern;
    depositing a block copolymer layer overlying the chemical guide pattern; and
    phase separating the block copolymer layer to define a nanopattern that is registered to the chemical guide pattern.

2. The method of claim 1, wherein forming the bifunctional brush layer comprises:
    depositing the polymeric material overlying the anti-reflective coating; and
    heating the polymeric material at a predetermined temperature to cross-link the pinning polymeric block portion.

3. The method of claim 2, wherein forming the bifunctional brush layer comprises heating the polymeric material at the predetermined temperature of from about 100 to about 350° C.

4. The method of claim 1, wherein forming the bifunctional brush layer comprises providing the polymeric material comprising the neutral polymeric block portion that comprises a random copolymer of polystyrene and polymethylmethacrylate.

5. The method of claim 1, wherein forming the bifunctional brush layer comprises providing the polymeric material comprising the pinning polymeric block portion that comprises random copolymer of styrene and HEMA, random copolymer of styrene and GMA, polystyrene with a terminal hydroxyl moiety, random copolymer of methylmethacrylate and HEMA, random copolymer of methylmethacrylate and GMA, or combinations thereof.

6. The method of claim 1, wherein the polymeric material further comprises a cleavable link portion that couples the neutral polymeric block portion and the pinning block portion together, and wherein selectively removing the portion of the neutral layer comprises selectively cleaving the cleavable link portion.

7. The method of claim 6, wherein forming the bifunctional brush layer comprises providing the polymeric material comprising the cleavable link portion that comprises trityl ether or nitro benzyl ether or other chemical groups with cleaving functions.

8. The method of claim 6, further comprising:
    depositing a photoresist layer overlying the bifunctional brush layer, and wherein selectively cleaving the cleavable link portion comprises:
    patterning the photoresist layer with ultraviolet light to selectively cleave the cleavable link portion.

9. The method of claim 8, wherein the photoresist layer is a chemically amplified photoresist layer, and wherein selectively cleaving the cleavable link portion comprises:
    patterning the chemically amplified photoresist layer with the ultraviolet light or extreme ultraviolet light to form an acid; and
    selectively cleaving the cleavable link portion with the acid.

10. The method of claim 9, wherein selectively cleaving the cleavable link portion further comprises:
    heating the chemically amplified photoresist layer at a temperature of from about 90 to about 130° C. contemporaneously with or subsequent to patterning the chemically amplified photoresist layer to facilitate forming the acid.

11. The method of claim 8, wherein patterning the photoresist layer comprises patterning the photoresist layer to selectively cleave the cleavable link portion with the ultraviolet light or extreme ultraviolet light.

12. The method of claim 8, wherein patterning the photoresist layer comprises patterning the photoresist layer with the ultraviolet light or extreme ultraviolet light to form an exposed photoresist portion and an unexposed photoresist portion, and wherein the method further comprises:
    removing the exposed or unexposed photoresist portions and the portion of the neutral layer or the pinning layer with an organic solvent to expose the chemical guide pattern.

13. The method of claim 1, wherein depositing the block copolymer layer comprises providing the block copolymer layer comprising a block copolymer of polystyrene and polymethylmethacrylate.

14. The method of claim 1, wherein phase separating comprises phase separating the block copolymer layer into polymethylmethacrylate block regions and polystyrene block regions, and wherein the method further comprises:
    removing the polymethylmethacrylate block regions to form a mask for transferring the nanopattern to the semiconductor substrate.

15. A method for creating chemical guide patterns by directed self-assembly (DSA) lithography for fabricating an integrated circuit comprising:
    forming a bifunctional brush layer of a polymeric material overlying an anti-reflective coating on a semiconductor substrate such that a pinning layer of the bifunctional brush layer is disposed adjacent to the anti-reflective coating and a neutral layer of the bifunctional brush layer is disposed adjacent to the pinning layer on a side opposite the anti-reflective coating, wherein the polymeric material comprises a neutral polymeric block portion and a pinning polymeric block portion that form the neutral layer and the pinning layer, respectively;
    selectively removing a portion of the neutral layer to define a chemical guide pattern;
    depositing a block copolymer layer overlying the chemical guide pattern; and
    phase separating the block copolymer layer to define a nanopattern that is registered to the chemical guide pattern.

16. The method of claim 15, wherein forming the bifunctional brush layer comprises:

depositing the polymeric material overlying the anti-reflective coating;

heating the polymeric material at a predetermined temperature to cross-link the pinning polymeric block portion.

17. The method of claim 15, wherein selectively removing the portion of the neutral layer comprises:

depositing a photoresist layer overlying the neutral layer; and patterning the photoresist layer with an electron beam.

18. The method of claim 17, wherein the neutral layer comprises a random copolymer of styrene and methylmethacrylate and the pinning layer comprises a random copolymer of styrene and HEMA, a random copolymer of styrene and GMA, polystyrene with a terminal hydroxyl moiety, or combinations thereof, and wherein patterning the photoresist layer comprises:

degrading polymethylmethacrylate with the electron beam or ultraviolet exposure for removing the portion of the neutral layer.

19. A method for creating chemical guide patterns by directed self-assembly (DSA) lithography for fabricating an integrated circuit comprising:

forming a bifunctional brush layer of a polymeric material overlying an anti-reflective coating on a semiconductor substrate such that a neutral layer of the bifunctional brush layer is disposed adjacent to the anti-reflective coating and a pinning layer of the bifunctional brush layer is disposed adjacent to the neutral layer on a side opposite the anti-reflective coating, wherein the polymeric material comprises a neutral polymeric block portion and a pinning polymeric block portion that form the neutral layer and the pinning layer, respectively;

selectively removing a portion of the pinning layer to define a chemical guide pattern;

depositing a block copolymer layer overlying the chemical guide pattern; and phase separating the block copolymer layer to define a nanopattern that is registered to the chemical guide pattern.

20. The method of claim 19, wherein forming the bifunctional brush layer comprises:

depositing the polymeric material overlying the anti-reflective coating; and heating the polymeric material at a predetermined temperature to cross-link the pinning polymeric block portion.

\* \* \* \* \*

UNITED STATES PATENT AND TRADEMARK OFFICE
CERTIFICATE OF CORRECTION

PATENT NO.         : 8,853,101 B1
APPLICATION NO.    : 13/841694
DATED              : October 7, 2014
INVENTOR(S)        : Richard A. Farrell et al.

Page 1 of 1

It is certified that error appears in the above-identified patent and that said Letters Patent is hereby corrected as shown below:

In the Title Page under (72) Inventors, please delete "xU Ji" and insert -- Ji Xu --.

Signed and Sealed this
Seventeenth Day of March, 2015

Michelle K. Lee
*Director of the United States Patent and Trademark Office*

UNITED STATES PATENT AND TRADEMARK OFFICE
CERTIFICATE OF CORRECTION

PATENT NO.          : 8,853,101 B1                         Page 1 of 1
APPLICATION NO.     : 13/841694
DATED               : October 7, 2014
INVENTOR(S)         : Richard A. Farrell et al.

It is certified that error appears in the above-identified patent and that said Letters Patent is hereby corrected as shown below:

<u>Title Page,</u>
Item [75], Inventors, "Ji Xu" (as corrected to read in the Certificate of Correction issued March 17, 2015) is deleted and patent is returned to its original state with third inventor's name in patent to read -- xU Ji --.

Signed and Sealed this
Fourteenth Day of April, 2015

Michelle K. Lee
*Director of the United States Patent and Trademark Office*